United States Patent [19]

Rioult

[11] 3,787,822

[45] Jan. 22, 1974

[54] METHOD OF PROVIDING INTERNAL CONNECTIONS IN A SEMICONDUCTOR DEVICE

[75] Inventor: Jean-Pierre Rioult, Epron, France

[73] Assignee: U.S. Philips Corporation, New York, N.Y.

[22] Filed: Apr. 13, 1972

[21] Appl. No.: 243,814

[30] Foreign Application Priority Data

Apr. 23, 1971 France .............................. 71.14550

[52] U.S. Cl. ............... 340/173 SP, 29/584, 117/212
[51] Int. Cl. ........................... G11c 17/00, H011 7/02
[58] Field of Search... 340/173 SP; 117/212; 29/584

[56] References Cited

UNITED STATES PATENTS

| | | | |
|---|---|---|---|
| 3,415,680 | 12/1968 | Perri | 117/212 |
| 3,447,961 | 6/1969 | Hitchcock | 117/212 |
| 3,479,237 | 11/1969 | Bergh | 117/212 X |
| 3,481,777 | 12/1969 | Spannhake | 117/212 |
| 3,597,834 | 8/1971 | Lathrop | 117/212 X |
| 3,702,786 | 11/1972 | Duffy | 117/212 |
| 3,576,549 | 4/1971 | Hess | 340/173 SP |
| 3,245,051 | 4/1966 | Robb | 340/173 SP |

OTHER PUBLICATIONS

Bracco, Write–Once Read Only Store, IBM Technical Disclosure Bulletin, 10/70, Vol. 13, No. 5, p. 1308

Abbas, Electronically Encodable Read–Only Store, IBM Technical Disclosure Bulletin, 11/70, Vol. 13, No. 6, pp. 1426–1427.

*Primary Examiner*—Vincent P. Canney
*Assistant Examiner*—Stuart Hecker
*Attorney, Agent, or Firm*—Frank R. Trifari

[57] ABSTRACT

Method of providing interconnection in a monolithic planar semiconductor device, comprising forming first conductor pattern connected to circuit element, providing apertured insulating layer thereover, providing a dielectric oxide layer at first pattern portion exposed through insulating layer aperture and removed from circuit element, and providing second conductor pattern having portion thereof on dielectric oxide layer, the patterns being electrically connected by applying therebetween potential sufficient to cause electrical breakdown in oxide layer. Also, product made by method.

9 Claims, 4 Drawing Figures

METHOD OF PROVIDING INTERNAL CONNECTIONS IN A SEMICONDUCTOR DEVICE

Figure 1:
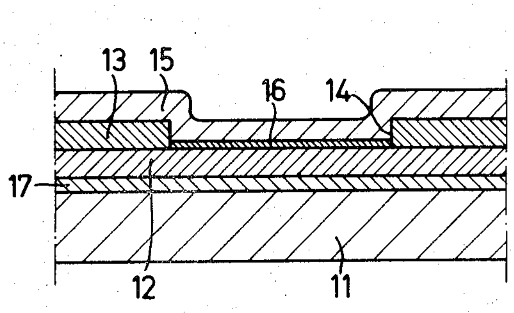

The present invention relates to a method of providing internal connections in a monolithic planar semiconductor device which comprises metal conductors which are deposited in at least two successive layers separated by an insulation layer.

The semiconductor devices from integrated circuit technology comprise many internal connections. In general a multilayer connection structure is used: a first pattern of conductors is obtained by deposition at the surface of the device, an insulation layer is then deposited and windows are opened in said layers at the desirable contact points, after which a second pattern of conductors is provided on the insulation layer of deposition and simultaneously on the surfaces of the first layer exposed by providing the windows. This structure which is termed "multilayer structure" and the performance of which requires a considerable equipment is justified by considerable series production.

Certain apparatus, for example, with multiple logic functions, however, require a large number of complex devices which are all of analogous structure but the circuits of which differ and require mutually different conductor patterns. This is the case especially with the "read only" memories, or passive memories, in which information is recorded once and can be read but not erased, which memories consist of integrated diodes and/or transistors in a monolithic plate. It has been endeavored to manufacture said memories starting from a base matrix the network of conductors and junctions of which comprise at least the conductors and the junctions of the memories to be manufactured, said matrix then enabling either an operation for destroying the excessive connections or an operation for providing the lacking connections.

A first method of manufacturing such memories which are termed programmable by the user, consists in providing for each of the possible connections in the network of the starting matrix a connection conductor having a weak point which may serve as a fuse. Current pulses transmitted selectively in the connections to be removed cause the evaporation of the fuse and the opening of the corresponding contact. This method involves a great danger of damage to the active semiconductor elements connected to the removed connection. The currents necessary for evaporating the fuse have a high intensity and the thermal dissipation may damage the adjacent active elements. The insulation may also be heavily loaded throughout the region where the heat dissipation takes place. Certain connections to be maintained run the risk of being destroyed by these currents. The connections which have a thinned portion moreover occupy a non-negligible surface area of the semiconductor plate to which is to be added that of the active element, while a minimum overall surface area is desirable. Furthermore the danger exists of an unforeseen closing of the contacts which are opened, in which the breakdown voltages of said interruptions are uncertain, and the danger of a considerable leakage current.

Another method starts from a base matrix in which at the area of each of the possibly necessary interconnections, diodes or opposite pairs of diodes are placed. The provision of the desirable contacts, which initially are all opened, is carried out by setting the corresponding diodes in the "avalanche" position and thus producing a short circuit of the junctions. This method requires a large number of extra semiconductor junctions which makes the device even more complicated and reduces its reliability; said junctions also require an extra surface area of the semiconductor plate and enlarge for the same number of times the space which the device occupies. The short circuits produced between the semiconductor regions retain a resistance. Furthermore, the insulation of the contacts which should remain open requires a polarisation which may not be desirable for the manufactured circuit arrangement.

It is the object of the present invention to mitigate the drawbacks of the above-mentioned methods and to realize interconnections in a planar semiconductor device by operations which are simple to perform, which require no specific important apparatus and which can be carried out even after the device has been enveloped.

Another object of the invention is to manufacture connections within a semiconductor device without the active elements of the device running the risk of being damaged and without much thermal energy being released by using minimum currents in the active elements.

Another object of the invention is to manufacture several semiconductor devices which comprise active elements and a network of connections starting from a base matrix the connection contacts of which are opened to be closed afterwards in accordance with the requirements of each device.

According to the invention, a method of providing interconnections in a monolithic planar semiconductor device which is provided with metal conductors deposited in at least two successive layers separated by an insulation layer, is characterized in that contacts are provided in certain points between conductors associated with the two metal layers separated by the insulation by providing in said insulation layer windows which expose, in at least the said certain points, faces of a first layer of metal conductors, such windows being provided providing on the surface of the said faces a thin dielectric oxide layer, depositing a second layer of metal conductors, and applying afterwards in the certain points between the two conductors present on either side of the said dielectric oxide layer a voltage which is at least equal to the breakdown voltage of said dielectric oxide layer.

The method according to the invention consumes for each contact to be provided a very small energy compared with the energy which is to be used for evaporating a fuse, as a result of which the danger of damage to the adjacent active elements or of insulations by the dissipated thermal energy is substantially avoided.

The method may be used for manufacturing socalled multilayer structures; the contacts are provided directly between the conductor layers and require no extra area of the plate; and the occupied plate is minimum. The method does not necessitate the manufacture of extra diode junctions and the reliability of the device is not reduced by it.

The disruption of a very thin dielectric oxide layer on a very small surface enables a contact of very small resistance to be obtained. The insulation in the points where the contact is not provided is an insulation by a dielectric which is to be preferred over the insulations by oppositely polarised junctions which the known methods necessitate: the leakage current is minimum and there is substantially no danger of incidental closing of a contact, so long as the voltage applied between the conductors present on either side of the dielectric oxide layer remains lower than the breakdown voltage of the dielectric layer.

The nature and the thickness of the dielectric oxide layer are determined with a view to obtaining a minimum breakdown voltage which is higher than the voltages which can be applied during operation between the conductors which are not connected together.

According to a preferred embodiment, the dielectric oxide layer which is formed at the surface of the exposed faces of the first layer of the metal conductors is obtained by superficial oxidation of said layer throughout the surface of the said faces. Said method is simple and uses operations which are known in the manufacture of semiconductors. When the metal conductors are of aluminium, the dielectric layer is formed by oxidation of the metal and consists mainly of aluminium oxide.

In the case of aluminium conductors, the superficial oxidation to form the dielectric layer preferably is an oxidation which is obtained by dipping in an oxidizing bath in the absence of any current supply from without, i.e., electrolessly. For example, in the case of aluminium oxide, the bath mainly consists of fuming nitric acid.

Said oxidation without the supply of a polarisation voltage from without is one of the simplest to be used and avoids the provision of all the contacts which necessitates the anodic oxidation of the usually used aluminium. When a conductor layer comprises many parts which are insulated from each other, the provision of a contact on each part presents great difficulties owing to the small dimensions of the devices.

The oxide layer obtained by the above-mentioned preferred methods presents a regular thickness and structure and the conditions which determine said properties are reproducible. A stabilisation treatment of the oxide layer may possibly be carried out to improve the dielectric properties thereof and, as a result, the regularity and the stability of the value of the breakdown voltage of said layer.

Oxides other than those of the metal constituting the conductors may be used in the method according to the invention. Said oxides are chosen in accordance with the control of their dielectric constant so as to improve the tolerances regarding the voltage necessary in the desirable contact points for the breakdown of the dielectric layer. For example, conductors may be manufactured by depositing aluminium, a layer of another metal, for example, titanium, tantalum, hafnium, niobium, zirconium is deposited on at least the surfaces of the conductors exposed by opening the windows in the insulation layer, after which said metal is oxidised throughout the surface of the faces and the second layer of aluminium conductors is deposited.

According to another variation of the method, the dielectric oxide layer is formed by direct deposition of an oxide, for example, by decomposition of an organometallic compound in the vapour phase.

The present invention also relates to monolithic planar semiconductor devices comprising metal conductors which are deposited in at least two successive layers separated by an insulation layer and the manufacture of which is carried out according to the method of the present invention. These devices are characterized in that the conductors of two layers separated by the said insulation can be contacted at certain points via a thin dielectric oxide layer which is located around said points on surfaces of the said insulation layer determined by opened windows.

The semiconductor devices according to the invention may fulfill all possible functions of the integrated circuits with known structure. A particularly favourable use of said device relates especially to the "read only" memories. The method according to the invention is suitable for manufacturing said memories by making them programmable after their manufacture, if necessary by the user. As a matter of fact, a base matrix of the memory can be manufactured without the contact between the conductors having been provided. The contacts are closed at the desirable points by breakdown of the dielectric oxide layer according to a "program" which is determined in accordance with the use. Programmable "read only" memories, with diodes and/or transistors, which are manufactured according to the invention are readily completed by the user, in accordance with his needs, by applying the required voltage to the terminals corresponding to the conductors between which the contact is to be provided. These memories are manufactured, for example, from an XY matrix, the voltages are applied between the line and column of the logic element to be provided in the circuit, the corresponding conductors being accessible from the outside of an envelope which comprises the memory matrix.

Although the so-called programmable matrices constitute one of the most favourable applications of the invention, it may also be used in all those cases of integrated circuits in which connections have to be provided afterwards, even after encapsulation of the device in a sealed envelope.

Figure 2:
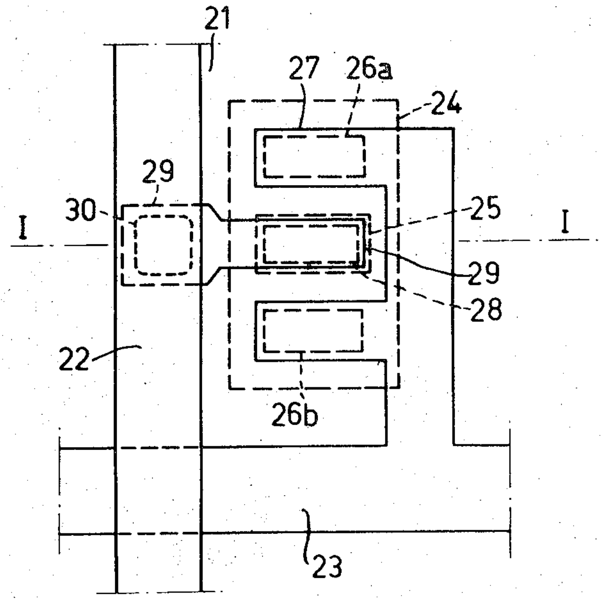
Figure 3:
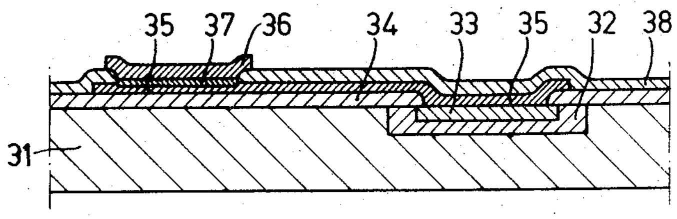
Figure 4:
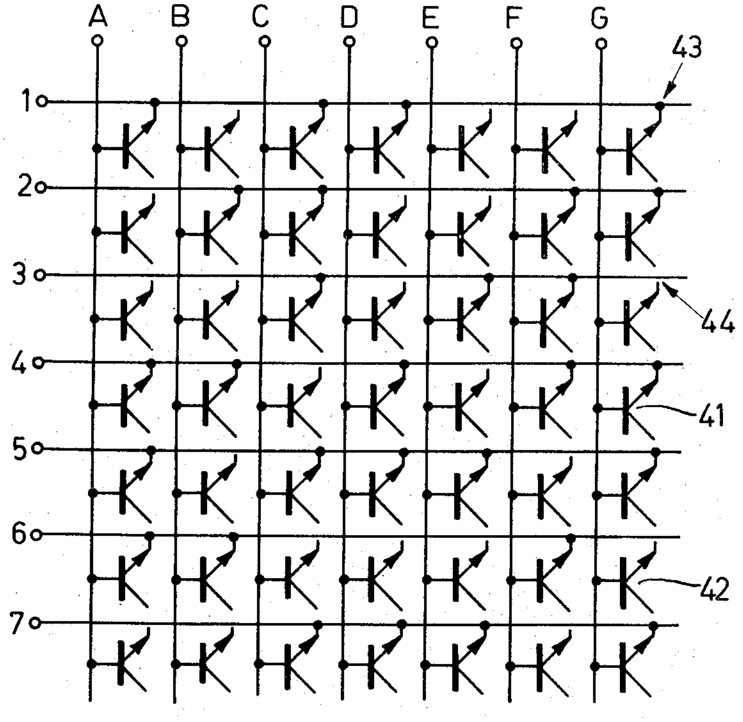

In order that the invention may be readily carried into effect, it will now be described in greater detail, by way of example, with reference to the accompanying drawings, in which FIG. 1 is a sectional view of a contact provided between two conductors, FIG. 2 is a plan view of a transistor integrated in a monolithic circuit and connected by means of a connection manufactured according to the invention, FIG. 3 is a sectional view of a transistor analogous to that shown in FIG. 2, FIG. 4 is a diagram of a programmable memory matrix using transistors.

The semiconductor device shown in FIG. 1 in a partial sectional view is manufactured, for example, in a plate of silicon 11. After the various epitaxy and diffusion treatments which may be required to obtain the various regions and junctions of the device, an insulation layer 17 of silicon oxide has formed at the surface of the plate. Windows are provided in said layer 17 and contacts are made via said windows, for example, by vapour depositing in a vacuum a metal layer 12, in general of aluminium. This layer 12 is converted into a first network of conductors, said conversion being preferably carried out by photoetching. A new insulation layer 13 is deposited on the plate and covers the first network of the conductors. Said insulation layer 13 is thick and its breakdown voltage is of the same order as that of the insulating intermediate layer of the multilayer circuit, usually more than ten times higher than tne maximum voltage which can be applied between two conductive layers.

Windows 14 are provided in the layer 13 in the places where contacts are to be provided, between the metal layer 12 and a conductor of another metal layer. The windows 14 are opened, for example, by the usual photoetching methods, in which the necessary operations are completed, if desirable, by a cleaning of the exposed conductive surface. A thin dielectric oxide layer 16 is formed on the surfaces of the layer 12 that are exposed by opening the windows and in particular on those layer where electrical contacts are to be made such electrical contacts being achieved according to the present invention even after the conductors 12 have been made directly in-accessible by the insulating layer 13 and the dielectric oxide layer 16.

Advantageously, the cleaning of the conductive surface and the formation of the dielectric oxide layer are reduced to an etching treatment by dipping in an oxidizing bath.

A conductive second layer 15 is deposited on the plate and converted into a network of conductors (a portion of which is shown by 15) according to the same method as that for the layer 12. This layer 15 will cover the dielectric oxide 16 which insulates it from the layer 12 on the surfaces corresponding to the windows 14.

In order to make a contact in the desirable places between the conductors of the two layers 12 and 15, voltage pulses are applied between said conductors in such manner that the dielectric 16 is pierced.

In an embodiment of a contact manufactured as described above, the two layers of conductors of vapour-deposited aluminium, each 1 to 1.2 micron thick, are separated by a silicon oxide layer, approximately 1 micron thick. The dielectric oxide layer is formed in the substantially square windows having sides of 15 microns by immersing the plate in a bath of fuming nitric acid at room temperature for 15 minutes. The formed dielectric layer has a breakdown voltage higher than 10 volts and lower than 15 volts and the leakage current between the two conductors separated by the dielectric layer is in the order of 1 $\mu$ amp. at a voltage of 3 volts. When the contacts are closed by voltage pulses having a maximum value of 13 to 15 volt and at most 1 $\mu$ amp., the breakdown gives them a resistance of less than 10 Ohm.

Contacts which are provided in a semiconductor plate as described are used in programmable "read only" memories, for example, the memory matrix the diagram of which is shown in FIG. 4. This matrix is manufactured starting from an XY matrix which comprises transistors arranged according to lines and columns and the bases of which are connected together by columns. The emitters are connected together by lines but the information which the memory is to contain is introduced in it by using a given selection of the transistor to be incorporated in the circuit. The selection is made on the emitter connections: some of them have to be provided as in 43, others have to be omitted as in 44.

Each transistor may present itself, for example, according to the plan of FIG. 2 (in which the insulation layers are shown as being transparent). The substrate 21 in this case plays the part of collector in which the base 24 is diffused. The emitter 25 is diffused in said base. A first insulation layer covers the plate and the apertures are provided in said insulation layer to expose a face 28 at the surface of each emitter and two faces 26*a* and 26*b* at the surface of each base 24. A first pattern of metal conductors 23, 27, 29 is deposited and a second insulation layer is provided to cover the plate. Apertures 30 are provided in the second insulation layer and expose contact zones on the conductors 29. An oxide layer is formed on said zones, after which a second pattern of metal conductors is deposited and constitutes the strips 22 which correspond to the lines 1 to 7 of FIG. 4, and covers the faces 30. For each transistor which is to be provided in the circuit, the dielectric layer which covers the face 30 is pierced by means of one or more voltage pulses which produces the necessary short circuit.

The sectional view of FIG. 3 corresponds substantially to a sectional view taken on the line I-I of FIG. 2. The emitter 33 and the base 32 are diffused in the substrate 31 which constitutes the collector. The strips which can be connected to certain emitters are referred to by reference numeral 36. A thin dielectric layer 37 is formed in the desirable contact points of the localised conductive layer 35 which contacts an emitter 33. The insulation layers separating the conductive layers and insulating the same from the substrate are referred to by reference numerals 38 and 34. When an emitter 33 is to be connected to a strip 36, the layer 37 is to be pierced and for that purpose one or several current pulses are transmitted through said layer by applying the required voltage between the conductors 35 and 36.

What is claimed is:

1. A method of providing interconnections in a monolithic planar semiconductor device, comprising a. providing a semiconductor substrate comprising at least one electronic circuit element at a major surface thereof;

b. providing a first metallic conductor pattern at said substrate surface, a portion of said pattern being in electrical contact with a part of said circuit element;

c. providing an electrically insulating layer over said surface and said first pattern, said layer comprising at least one aperture that extends therethrough and is located at part of said first pattern removed from said circuit element, said part being exposed;

d. providing through said aperture a dielectric oxide layer located at only said exposed part of said pattern, said dielectric layer being characterized by a breakdown voltage lower than that of said insulating layer; and e. providing a second metallic conductor pattern partially located on said dielectric oxide layer, other regions of said first and second patterns being separated by said electrically insulating layer, whereby said circuit element part is electrically energized via said second pattern by applying between said first and second patterns a voltage causing electrical breakdown of said dielectric layer.

2. A method as recited in claim 1, wherein said dielectric oxide layer is formed by superficially oxidizing said exposed part of said first metal conductor pattern.

3. A method as recited in claim 1, wherein said first and second patterns are produced by vapor depositing aluminum and said dielectric oxide layer consists essentially of aluminum oxide, said insulating layer which separates said patterns consisting essentially of silicon dioxide.

4. A method as recited in claim 1, wherein said dielectric oxide layer is electrolessly formed at surface regions of said first conductor pattern by dipping said substrate in an oxidizing bath.

5. A method as recited in claim 1, wherein said dielectric oxide layer is subjected to a stabilization treatment.

6. A method as recited in claim 1, wherein said dielectric oxide layer is formed by depositing an oxide originating from a reaction in the gaseous phase of an organo-metallic compound.

7. A method as recited in claim 1, wherein said dielectric oxide is selected from the group consisting of titanium oxide, tantalum oxide, hafnium oxide, zirconium oxide and niobium oxide.

8. A monolithic planar semiconductor device, comprising:

a. a semiconductor substrate including at least one electronic circuit element at a major surface thereof;

b. a first metallic conductor pattern disposed at said substrate surface, a portion of said pattern being electrically connected to a part of said circuit element;

c. an apertured electrically insulating layer disposed over said surface and said first pattern, said aperture extending through said layer and being located at a part of said first pattern removed from said circuit element;

d. a dielectric oxide layer disposed on said part of said first pattern, and e. a second metallic conductor pattern partially located on said dielectric oxide layer, other regions of said first and second patterns being separated by said electrically insulating film, said dielectric oxide layer having a breakdown voltage significantly less than said insulating layer.

9. A planar monolithic programmable memory matrix comprising semiconductor devices, said matrix comprising at least two metal conductor layers and an insulating layer disposed between said conductor layers, at least one of said devices being electrically connected to a portion of a first one of said conductor layers, said insulating layer comprising a discontinuity extending completely therethrough to said first conductor layer at a point removed from said device, a dielectric oxide layer being disposed at said discontinuity between said conductor layers and between respective portions of said conductor layers located at said discontinuity, said dielectric layer being characterized by an electrical breakdown voltage significantly less than that of said insulating layer, portions of said conductor layers being available for electrical connection to a potential source, whereby said conductor layers are electrically connected to each other by applying therebetween an electrical potential exceeding said dielectric layer breakdown voltage.

* * * * *